(12) United States Patent
Xu et al.

(10) Patent No.: US 10,802,063 B2
(45) Date of Patent: Oct. 13, 2020

(54) DETECTION DEVICE AND DETECTION METHOD

(71) Applicants: BOE TECHNOLOGY GROUP CO., LTD., Beijing (CN); Ordos Yuansheng Optoelectronics Co., Ltd., Inner Mongolia (CN)

(72) Inventors: Haiyan Xu, Beijing (CN); Dong Wang, Beijing (CN); Wenlong Zhao, Beijing (CN); Huan Tang, Beijing (CN); Hyunjin Kim, Beijing (CN); Lei Zhang, Beijing (CN); Zhao Wang, Beijing (CN); Le Sun, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 80 days.

(21) Appl. No.: 16/129,234

(22) Filed: Sep. 12, 2018

(65) Prior Publication Data
US 2019/0271727 A1    Sep. 5, 2019

(30) Foreign Application Priority Data
Mar. 2, 2018  (CN) .......................... 2018 1 0176066

(51) Int. Cl.
*G01R 27/26*     (2006.01)
*H03K 17/955*    (2006.01)
(Continued)

(52) U.S. Cl.
CPC .......... *G01R 27/2605* (2013.01); *G01D 5/24* (2013.01); *H03K 17/955* (2013.01); *H03K 2017/9602* (2013.01); *H03K 2217/960775* (2013.01)

(58) Field of Classification Search
CPC ....................................................... G01D 5/24
See application file for complete search history.

(56) References Cited

U.S. PATENT DOCUMENTS 9,244,104 B2    1/2016  Hahl et al.
2013/0207674 A1 8/2013  Hahl et al.
(Continued)

FOREIGN PATENT DOCUMENTS

CN    201237579 Y    5/2009
CN    102230908 A    11/2011
(Continued)

OTHER PUBLICATIONS

First Office Action, including Search Report, for Chinese Patent Application No. 201810176066.4, dated Oct. 31, 2019, 23 pages.
(Continued)

*Primary Examiner* — Christopher E Mahoney
(74) *Attorney, Agent, or Firm* — Westman, Champlin & Koehler, P.A.

(57) ABSTRACT

The embodiments of the present application provide a detection method and a detection device. The detection device includes: a capacitance generation circuit comprising a first capacitance electrode and a second capacitance electrode disposed opposite to each other, and a power source coupled to the first and the second capacitance electrode, the first capacitance electrode is an electrode plate, and the second capacitance electrode comprises n sub-electrodes which are provided to be insulated from each other; at least one capacitance detection circuit coupled to the electrode plate and the sub-electrodes, and configured to detect a capacitance value between the electrode plate and the sub-electrodes in response to a substrate to be tested being placed on one side of the electrode plate; and a controller configured to determine, according to the detected capacitance
(Continued)

value, whether a foreign object exists in a region on the substrate to be tested or not.

15 Claims, 6 Drawing Sheets

(51) Int. Cl.
    *G01D 5/24*          (2006.01)
    *H03K 17/96*       (2006.01)

(56) References Cited

U.S. PATENT DOCUMENTS

| | | | | |
|---|---|---|---|---|
| 2013/0342225 | A1* | 12/2013 | Gehrig | G01N 33/365 324/684 |
| 2014/0183970 | A1* | 7/2014 | Kurihara | B60L 53/65 307/104 |
| 2015/0288214 | A1* | 10/2015 | Borngraber | G01D 5/24 382/103 |
| 2019/0190324 | A1* | 6/2019 | Bossetti | H02J 50/10 |

FOREIGN PATENT DOCUMENTS

| | | |
|---|---|---|
| CN | 102959390 A | 3/2013 |
| CN | 103226123 A | 7/2013 |
| CN | 103424065 A | 12/2013 |
| CN | 204905256 U | 12/2015 |

OTHER PUBLICATIONS

Second Office Action, including Search Report, for Chinese Patent Application No. 201810176066.4, dated Apr. 14, 2020, 25 pages.

\* cited by examiner

DETECTION DEVICE AND DETECTION METHOD

CROSS-REFERENCE TO RELATED APPLICATION(S)

This application claims priority to the Chinese Patent Application No. 201810176066.4, filed on Mar. 2, 2018, which is incorporated herein by reference in its entirety.

TECHNICAL FIELD

The present disclosure relates to a field of display, and more particularly, to a detection device and a detection method.

BACKGROUND

In a field of display, there is an impact of effective monitoring of foreign objects on a product yield of display products.

SUMMARY

An aspect of the embodiments of the present disclosure provides a detection device, comprising:

a capacitance generation circuit comprising a first capacitance electrode and a second capacitance electrode disposed opposite to each other, and a power source coupled to the first capacitance electrode and the second capacitance electrode, wherein the first capacitance electrode is an electrode plate, and the second capacitance electrode comprises n sub-electrodes which are provided to be insulated from each other, where n is an integer greater than or equal to 1;

at least one capacitance detection circuit coupled to the electrode plate and the sub-electrodes, and configured to detect a capacitance value between the electrode plate and the sub-electrodes in response to a substrate to be tested being placed on one side of the electrode plate which is close to the second capacitance electrode; and a controller configured to determine, according to the detected capacitance value, whether a foreign object exists in a region on the substrate to be tested or not.

In an example, the capacitance generation circuit further comprises: an insulating plate in which the sub-electrodes are embedded.

In an example, the capacitance generation circuit further comprises: an electrical connection plate disposed on one side of the insulating plate away from the sub-electrodes; and a wire configured to connect the n sub-electrodes to the electrical connection plate through via holes in the insulating plate, and connect the n sub-electrodes to the power source through the electrical connection plate.

In an example, the detection device further comprises: a lifting apparatus coupled to the insulating plate, wherein the lifting apparatus is configured to drive the second capacitance electrode to move in a direction perpendicular to the first capacitance electrode under a control of the controller.

In an example, the detection device further comprising: a lifting apparatus coupled to the electrical connection plate, wherein the lifting apparatus is configured to drive the second capacitance electrode to move in a direction perpendicular to the first capacitance electrode under a control of the controller.

In an example, the n sub-electrodes have the same size and shape.

In an example, the n sub-electrodes are arranged in an array.

In an example, there are n capacitance detection circuits, and the capacitance detection circuits are coupled to the sub-electrodes in one-to-one correspondence.

In an example, there is one capacitance detection circuit, and the detection device further comprises:

switching units disposed between the sub-electrodes and the capacitance detection circuit, and configured to control turn-on and turn-off of connections between the sub-electrodes and the capacitance detection circuit.

In an example, the electrode plate is a metal film, and the sub-electrodes are metal sheets.

In an example, the detection device further comprises: a test abutment configured to support the electrode plate.

In an example, the controller is configured to:

compare the capacitance value with a standard capacitance value, and determine that a foreign object exists in the region on the substrate to be tested, in response to an absolute value of a difference between the capacitance value and the standard capacitance value being greater than a preset threshold; and determine that no foreign object exists in the region on the substrate to be tested, in response to the absolute value of the difference between the capacitance value and the standard capacitance value being less than or equal to the preset threshold.

In an example, the standard capacitance value is set to a capacitance value between the sub-electrodes and the electrode plate when no foreign object exists in the region on the substrate to be tested.

Another aspect of the embodiments of the present disclosure proposes a detection method applied to the detection device according to the embodiments of the present disclosure, comprising:

supplying, by a power source, power to the first capacitance electrode and the second capacitance electrode in the capacitance generation circuit;

detecting, by the capacitance detection circuit, a capacitance value between the electrode plate and the sub-electrodes in response to the substrate to be tested being placed on one side of the electrode plate which is close to the second capacitance electrode; and determining, by the controller, according to the detected capacitance value, whether a foreign object exists in a region on the substrate to be tested or not.

In an example, determining whether a foreign object exists in a region on the substrate to be tested or not comprises:

comparing, by the controller, the capacitance value with a standard capacitance value, and determining that a foreign object exists in the region on the substrate to be tested, in response to an absolute value of a difference between the capacitance value and the standard capacitance value being greater than a preset threshold; and determining, by the controller, that no foreign object exists in the region on the substrate to be tested, in response to the absolute value of the difference between the capacitance value and the standard capacitance value being less than or equal to the preset threshold.

In an example, the standard capacitance value is set to a capacitance value between the sub-electrodes and the electrode plate when no foreign object exists in the region on the substrate to be tested.

BRIEF DESCRIPTION OF THE DRAWINGS

The accompanying drawings are used to provide a further understanding of the technical solutions of the present disclosure, and constitute a part of the specification. The accompanying drawings are used to explain the technical solutions of the present disclosure together with the embodiments of the present application, and do not constitute a limitation on the technical solutions of the present disclosure. In the accompanying drawings.

DETAILED DESCRIPTION

The embodiments of the present disclosure will be described in detail below with reference to the accompanying drawings. It should be illustrated that, the embodiments in the present application and the features in the embodiments can be combined with each other randomly without a conflict.

Steps illustrated in the flowchart of the accompanying drawings may be executed in a computer system such as a set of computer executable instructions. Further, although a logical order is shown in the flowchart, in some cases, the steps shown or described may be performed in an order different from the one here.

A method for monitoring a foreign object may comprise a test method of an Automatic Optic Inspection (AOI) device, for example, a five-point method and a picture method. The five-point method comprises measuring distances between five points in a detection region and the AOI device at the same time; if the distances between the five points and the AOI device are the same, it is considered that no foreign object exists in the detection region; and if the distances between the five points and the AOI device are not the same, it is considered that a foreign object exists in the detection region. In the picture method, a shape of a foreign object is obtained by taking a picture of a detection region. An existing AOI device can only take a 2D picture, and therefore cannot determine basic characteristics of the foreign object, and has a test dead angle due to the limitation of the measurement principle. For example, a Gate Driver on Array (GOA) region cannot be measured. In addition, the five-point method and the picture method are single-point test methods, which are inefficient and take a long time to test.

Figure 1:
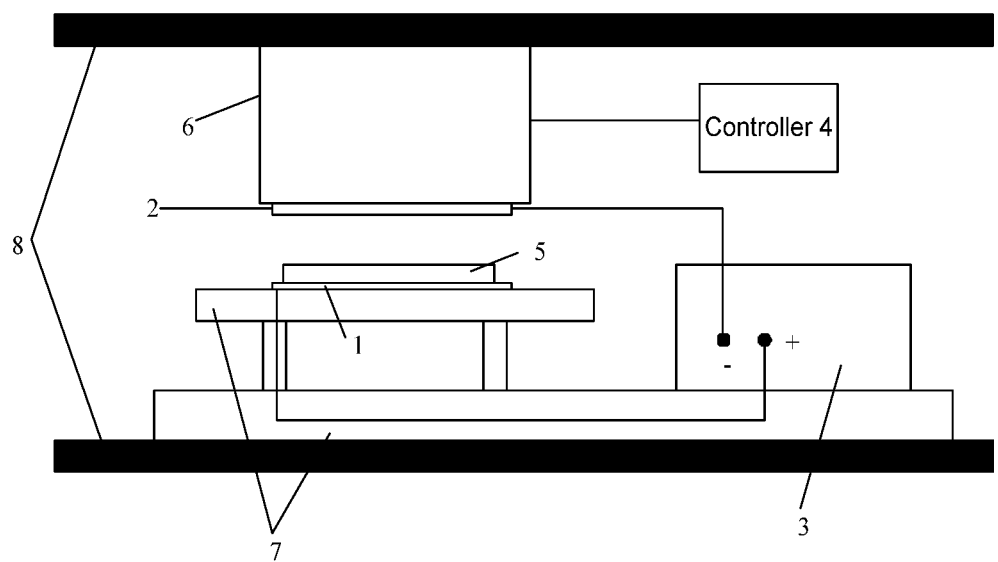
FIG. 1 illustrates a schematic diagram of a detection device according to an embodiment of the present disclosure.

The embodiments of the present disclosure propose a detection device. As shown in FIG. 1, the detection device according to the embodiment of the present disclosure may comprise a capacitance generation circuit comprising a first capacitance electrode 1 and a second capacitance electrode 2 disposed opposite to each other, and a power source 3 coupled to the first capacitance electrode 1 and the second capacitance electrode 2. The first capacitance electrode 1 is an electrode plate, and the second capacitance electrode 2 comprises n sub-electrodes 21 which are provided to be insulated from each other, where n is an integer greater than or equal to 1. One side of the first capacitance electrode 1 which is close to the second capacitance electrode is configured to have a substrate 5 to be tested placed thereon. The detection device may further comprise at least one capacitance detection circuit 13 coupled to the electrode plate and the sub-electrodes 21, and configured to detect a capacitance value between the electrode plate and the sub-electrodes 21 in response to the substrate 5 to be tested being placed on one side of the electrode plate which is close to the second capacitance electrode 2. The detection device may further comprise a controller 4 configured to determine, according to the detected capacitance value, whether a foreign object exists in a region on the substrate 5 to be tested or not. For example, the substrate 5 to be tested may be a glass substrate, a color film substrate, or an array substrate etc., which is not limited in the embodiment of the present disclosure.

According to the detection device according to the embodiment of the present disclosure, foreign objects can be quickly and accurately detected using the capacitance sensing principle, thereby improving the detection efficiency.

According to an embodiment of the present disclosure, the electrode plate may be a conductive film, and the sub-electrodes 21 may be conductive sheets. For example, the conductive film is a metal film, and the conductive sheets are metal sheets.

For example, different sub-electrodes 21 may be provided to be insulated from each other by embedding the sub-electrodes 21 in an insulating plate 12.

According to an embodiment of the present disclosure, shapes and sizes of the sub-electrodes 21 and a number of the sub-electrodes 21 are not limited, as long as a size of a region formed by arranging the n sub-electrodes 21 in a predetermined manner is greater than or equal to a size of the substrate 5 to be tested.

When the n sub-electrodes 21 have the same size and shape, the same standard capacitance value may be set for all the sub-electrodes, thereby improving the detection efficiency.

In order to improve the detection accuracy, it is better to have a small area of each of the sub-electrodes 21 as much as possible. Further, the shapes of the sub-electrodes 21 may be selected so that a gap between the sub-electrodes 21 is as small as possible in a process of the arrangement.

For example, the sub-electrodes 21 may have any of a square shape, a rectangular shape, a hexagonal shape, etc.

When the sub-electrodes 21 has a square shape, the square may have a side length of 0.5 millimeters (mm).

Figure 2:
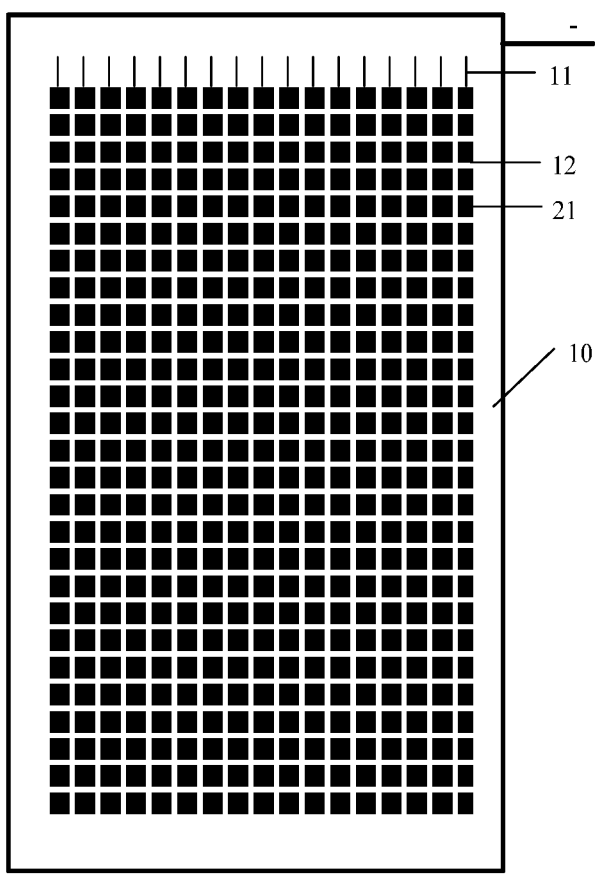
FIG. 2 illustrates a schematic diagram of an arrangement of sub-electrodes according to an embodiment of the present disclosure.
Figure 3:
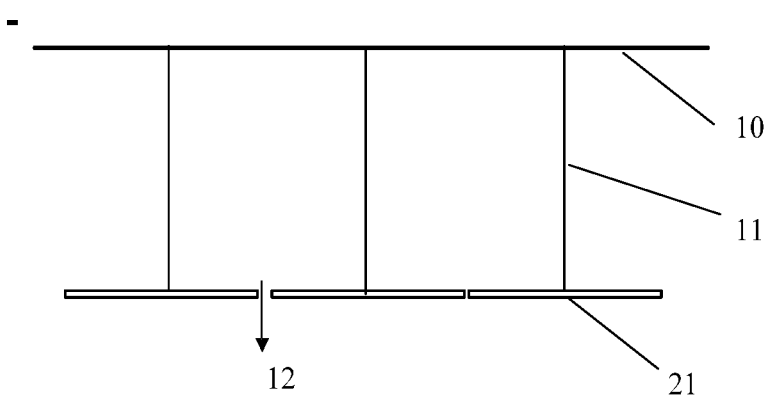
FIG. 3 illustrates a schematic diagram of connections between sub-electrodes and a conductive substrate according to an embodiment of the present disclosure.

Here, when the n sub-electrodes 21 are arranged in an array, it is convenient to position a foreign object. That is, the n sub-electrodes 21 may be arranged in X rows and Y columns, and center points of sub-electrodes 21 located in the same row or the same column are on the same straight line, where X and Y are integers greater than or equal to 1. As shown in FIG. 2, the square sub-electrodes 21 are arranged in 27 rows and 17 columns, numbers of sub-electrodes 21 in different rows are the same, and numbers of sub-electrodes 21 in different columns are also the same. Finally, the square sub-electrodes 21 are arranged in a rectangular shape. Further, intervals between two adjacent sub-electrodes 21 are the same.

In the detection device according to the embodiment of the present disclosure, the sub-electrodes 21 are coupled to a first pole of the power source 3, and the electrode plate is coupled to a second pole of the power source 3. For example, the sub-electrodes 21 are coupled to a positive pole of the power source 3, and the electrode plate is coupled to a negative pole of the power source 3. As shown in the exemplary connection manner of FIG. 1, the sub-electrodes 21 are coupled to the negative pole of the power source 3, and the electrode plate is coupled to the positive pole of the power source 3. That is, the first pole of the power source 3 is a positive pole, and the second pole of the power source 3 is a negative pole; or the second pole of the power source 3 is a positive pole, and the first pole of the power source 3 is a negative pole.

In the above detection device, the sub-electrodes 21 may be directly coupled to the power source 3 via a wire 11. Alternatively, the above detection device further comprises an electrical connection plate 10 disposed on one side of the insulating plate 12 away from the sub-electrodes 21. The wire 11 for connecting the n sub-electrodes 21 is coupled to the electrical connection plate 10 through via holes in the insulating plate 12, and is coupled to the power source 3 through the electrical connection plate 10.

In an exemplary embodiment, the above detection device may further comprise: a lifting apparatus 6 coupled to the insulating plate 12 or the electrical connection plate 10. The lifting apparatus 6 drives the second capacitance electrode 2 to move in a direction perpendicular to the first capacitance electrode 1 under the control of the controller 4. The lifting apparatus 6 may adjust its own height under the control of the controller 4, thereby adjusting a height of the second capacitance electrode 2, i.e., adjusting a distance between the sub-electrodes 21 and the electrode plate.

In an exemplary embodiment, the above detection device further comprises: a test abutment 7 configured to support the electrode plate.

In an exemplary embodiment, the above detection device further comprises: a casing 8. The casing 8 may be formed of an insulating material.

According to an embodiment of the present disclosure, a thickness of the electrode plate is not limited, for example, the electrode plate may have a thickness of 1 mm.

According to an embodiment of the present disclosure, it is better to have a large area of a region where the insulating plate 12 is overlapped with the electrode plate as much as possible. The larger the overlapping area, the larger the area of the substrate which may be detected.

In an exemplary embodiment, in order to improve the detection accuracy of the capacitance value between the sub-electrodes 21 and the electrode plate, the capacitance detection circuit 13 may be a digital bridge, for example, a precision LCR digital bridge with a model of TH2817A or TH2619. Test terminals for the TH2817A are a current high-terminal HD, a voltage high-terminal HS, a current low-terminal LD, and a voltage low-terminal LS, and when capacitors composed of the sub-electrodes 21 and the electrode plate are coupled to the digital bridge, both the current high-terminal HD and the voltage high-terminal HS of the digital bridge are coupled to the sub-electrodes 21, and both the current low-terminal LD and the voltage low-terminal LS are coupled to the electrode plate. Alternatively, both the current high-terminal HD and the voltage high-terminal HS are coupled to the electrode plate, and both the current low-terminal LD and the voltage low-terminal LS are coupled to the sub-electrodes 21.

Although the TH2817A-type precision LCR digital bridge can accurately detect the capacitance, the accuracy of the capacitance is also related to many factors, for example, capacitors themselves formed between the sub-electrodes 21 and the electrode plate, and a line for connecting the capacitors. In order to further improve the accuracy of the detection, the sub-electrodes 21 and the electrode plate are firstly insulated respectively before the capacitance is detected.

According to an embodiment of the present disclosure, capacitance between all the sub-electrodes 21 and the electrode plate may be detected using at least one capacitance detection circuit 13. Each of the at least one capacitance detection circuit 13 realizes detection of capacitance between at least one of the sub-electrodes 21 and the electrode plate.

Figure 4:
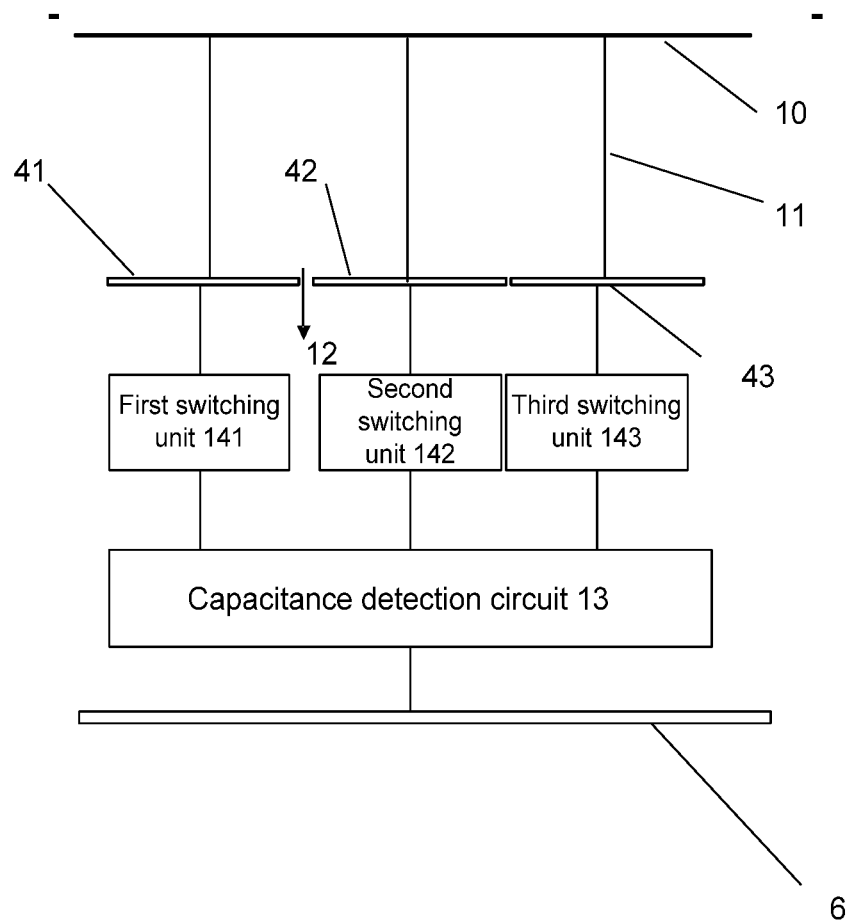
FIG. 4 illustrates a schematic diagram of a detection device comprising one capacitance detection circuit according to an embodiment of the present disclosure.

For example, as shown in FIG. 4, the capacitance between all the sub-electrodes 21 and the electrode plate is detected using one capacitance detection circuit 13, and n switching units may be disposed between the sub-electrodes 21 and the capacitance detection circuit 13. The n switching units are configured to control turn-on and turn-off of connections between the sub-electrodes 21 and the capacitance detection circuit 13. As shown in FIG. 4, a first switching unit 141 is disposed between a first sub-electrode 41 and the capacitance detection circuit 13, a second switching unit 142 is disposed between a second sub-electrode 42 and the capacitance detection circuit 13, and a third switching unit 143 is disposed between a third sub-electrode 43 and the capacitance detection circuit 13. It should be illustrated that the sub-electrodes and the switching units shown in FIG. 4 are only given as a schematic diagram for explaining connections between the sub-electrodes 21, the switching units, and the capacitance detection circuit 13, and specific numbers of the sub-electrodes 21 and the switching units are not limited in the embodiments of the present disclosure.

In this case, the controller 4 needs to control turn-on and turn-off of the switching units in a time-division manner, so that capacitance values detected by the capacitance detection circuit 13 are read in a time-division manner. That is, at a first time, the controller 4 controls the first switching unit 141 to be turned on, and controls other switching units to be turned off, so that a first capacitance value between the first sub-electrode 41 and the electrode plate is read; at a second time, the controller 4 controls the second switching unit 142 to be turned on, and controls other switching units to be turned off, so that a second capacitance value between the second sub-electrode 42 and the electrode plate is read; at a third time, the controller 4 controls the third switching unit 143 to be turned on, and controls other switching units to be turned off, so that a third capacitance value between the third sub-electrode 43 and the electrode plate is read; and so on, until capacitance values between all the sub-electrodes 21 and the electrode plate are read.

The above n switching units may be implemented by using an array switch or a switch grid structure in a display panel.

Figure 5:
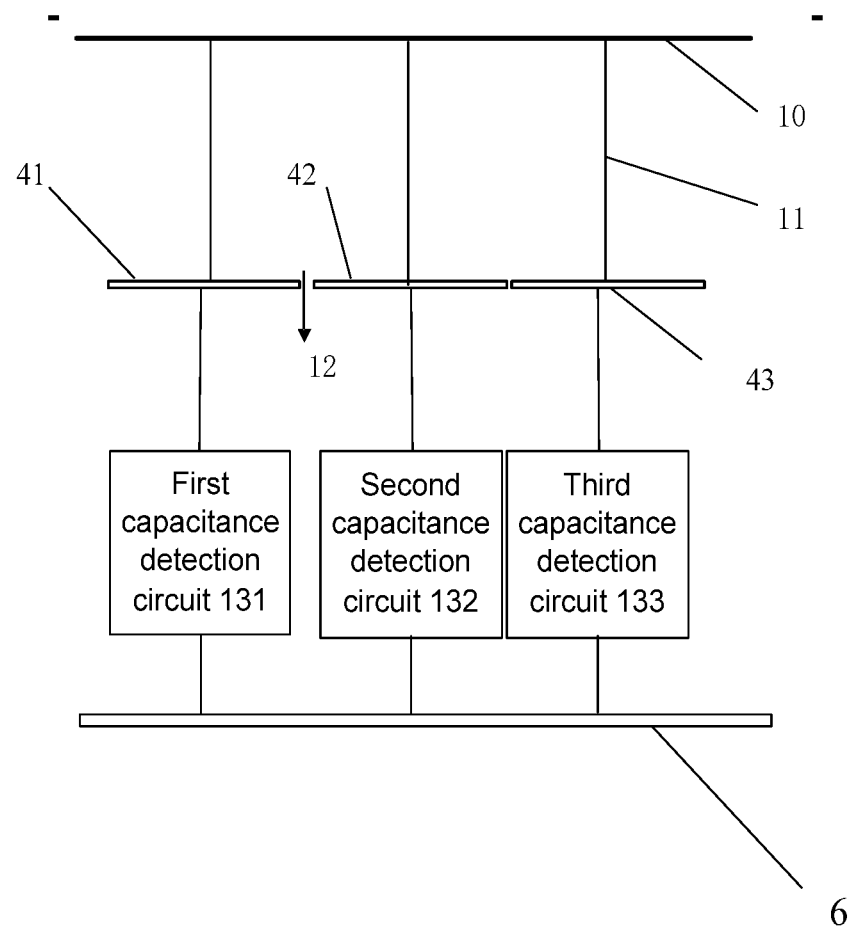
FIG. 5 illustrates a schematic diagram of a detection device comprising n capacitance detection circuits according to an embodiment of the present disclosure.

As shown in FIG. 5, the capacitance between all the sub-electrodes 21 and the electrode plate may be detected using n capacitance detection circuits 13. As shown in FIG. 5, the capacitance detection circuits 13 are coupled to the sub-electrodes 21 in one-to-one correspondence. A first capacitance detection circuit 131 is coupled to a first sub-electrode 41, a second capacitance detection circuit 132 is coupled to a second sub-electrode 42, and a third capacitance detection circuit 133 is coupled to a third sub-electrode 43. It should be illustrated that the sub-electrodes 21 and the capacitance detection circuits 131 shown in FIG. 5 are only given as a schematic diagram for explaining connections between the sub-electrodes 21 and the capacitance detection circuits 13, and specific numbers of the sub-electrodes 21 and the capacitance detection circuits 13 are not limited in the present application.

In this case, the controller 4 may read capacitance values detected by the n capacitance detection circuits 13 at the same time.

For example, the controller 4 is further configured to: compare the detected capacitance value with a standard capacitance value, and determine that a foreign object exists in a region on the substrate to be tested when an absolute value of a difference between the detected capacitance value and the standard capacitance value is greater than a preset threshold; and determine that no foreign object exists in the region on the substrate to be tested when the absolute value of the difference between the detected capacitance value and the standard capacitance value is less than or equal to the preset threshold.

Here, the standard capacitance value is set to a capacitance value between the sub-electrodes and the electrode plate when no foreign object exists in the region on the substrate to be tested.

Figure 6:
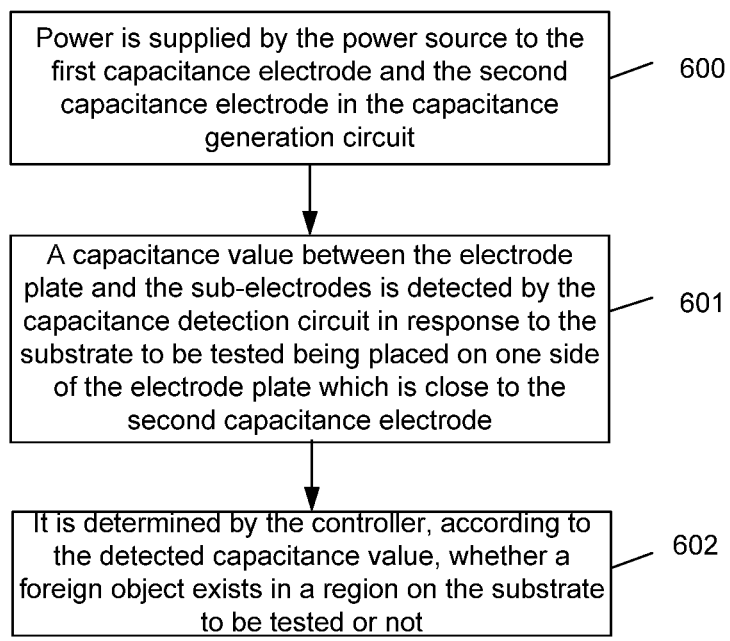
FIG. 6 illustrates a flowchart of a detection method according to an embodiment of the present disclosure.

As shown in FIG. 6, the embodiments of the present disclosure propose a detection method applied to the detection device according to the embodiments of the present disclosure. As shown in FIG. 6, the detection method may comprise the following steps.

In step 600, power is supplied by the power source to the first capacitance electrode and the second capacitance electrode in the capacitance generation circuit.

In step 601, a capacitance value between the electrode plate and the sub-electrodes is detected by the capacitance detection circuit in response to the substrate to be tested being placed on one side of the electrode plate which is close to the second capacitance electrode.

In the present embodiment, in order to improve the detection accuracy of the capacitance value between the sub-electrodes and the electrode plate, the capacitance value between the sub-electrodes and the electrode plate may be detected using a digital bridge, for example, a precision LCR digital bridge with a model of TH2817A or TH2619. Test terminals for the TH2817A are a current high-terminal HD, a voltage high-terminal HS, a current low-terminal LD, and a voltage low-terminal LS, and when capacitors composed of the sub-electrodes and the electrode plate are coupled to the digital bridge, both the current high-terminal HD and the voltage high-terminal HS of the digital bridge are coupled to the sub-electrodes, and both the current low-terminal LD and the voltage low-terminal LS are coupled to the electrode plate. Alternatively, both the current high-terminal HD and the voltage high-terminal HS are coupled to the electrode plate, and both the current low-terminal LD and the voltage low-terminal LS are coupled to the sub-electrodes.

Although the TH2817A-type precision LCR digital bridge can accurately detect the capacitance, the accuracy of the capacitance is also related to many factors, for example, capacitors themselves formed between the sub-electrodes and the electrode plate, and a line for connecting the capacitors. In order to further improve the accuracy of the detection, the sub-electrodes and the electrode plate may be firstly insulated respectively before the capacitance is detected.

In step 602, it is determined by the controller, according to the detected capacitance value, whether a foreign object exists in a region on the substrate to be tested or not.

For example, the controller compares the detected capacitance value with the standard capacitance value, and the controller determines that a foreign object exists in the region on the substrate to be tested in response to the absolute value of the difference between the detected capacitance value and the standard capacitance value being greater than a preset threshold; and the controller determines that no foreign object exists in the region on the substrate to be tested in response to the absolute value of the difference between the detected capacitance value and the standard capacitance value being less than or equal to the preset threshold.

The standard capacitance value may be set to a capacitance value between the sub-electrodes and the electrode plate when no foreign object exists in the region on the substrate to be tested.

As pattern regions on the substrate to be tested are different for different sub-electrodes, various sub-electrodes may for different standard capacitance values.

For example, the standard capacitance value may be obtained in any of the following manners. According to an example, with the capacitance superposition principle, when a foreign object exists in a region on the substrate to be tested being a metal sheet, a capacitance value between the sub-electrode and the electrode plate is greater than a capacitance value when no foreign object exists. Therefore, for a batch of substrates to be tested, there may be a region without a foreign object among regions on different substrates to be tested for the same sub-electrode. The plurality of substrates to be tested may be sequentially placed at the same position on the electrode plate. A capacitance value between each sub-electrode and the electrode plate is detected, and a minimum value of the capacitance values between the same sub-electrode on the plurality of substrates to be tested and the electrode plate is taken as the standard capacitance value. In order to improve an accuracy of the standard capacitance value, more substrates may be selected to be tested.

According to another example, ID information of the substrate to be tested may be obtained in advance, and then a standard capacitance value corresponding to the ID information of the substrate to be tested is searched for according to a correspondence relationship between ID information and standard capacitance values.

The ID information of the substrate to be tested may be obtained using any of the following methods.

1. being coupled to another device and receiving ID information transmitted by the other device;

2. reading ID information at an edge of the substrate to be tested; for example, obtaining the ID information by reading a two-dimensional code or a label at the edge of the substrate to be tested; and 3. presetting the ID information of the substrate to be tested.

Here, the correspondence relationship may be preset or may be obtained from an external device.

According to another example, the standard capacitance value of the substrate to be tested may be preset.

According to an embodiment of the present disclosure, it is assumed that the substrate 5 to be tested comprises a base and a film layer (such as $SiO_2$) on the base. Ideally, a foreign object is located on an uppermost film layer of the substrate 5 to be tested, and is not embedded in an underlying film layer of the substrate 5 to be tested. In this case, when a foreign object exists on the substrate 5 to be tested, capacitance between a sub-electrode 21 and the electrode plate may be equivalent to parallel capacitance of the following two parts: capacitance of a region where the foreign object exists, and capacitance of a region where no foreign object exists.

Therefore, when no foreign object exists in the region on the substrate to be tested which corresponds to the sub-electrode 21, the measured capacitance value $C_1$ is:

$$C_1 = \frac{\varepsilon_0 S_1}{\frac{D_3}{\varepsilon_{glass}} + \frac{D_2}{\varepsilon_{SiO2}} + D_1};$$

where $C_1$ is a capacitance value between the sub-electrode and the electrode plate when no foreign object exits in the region on the substrate to be tested for the sub-electrode, $\varepsilon_0$ is a dielectric constant of a vacuum medium, $\varepsilon_{glass}$ is a relative dielectric constant of the base, $\varepsilon_{SiO2}$ is a relative dielectric constant of an $SiO_2$ layer, $D_1$ is a height of a vacuum layer, $D_2$ is a height of the $SiO_2$ layer, $D_3$ is a height of the base, and S1 is an area of the sub-electrode.

When a foreign object (such as $Si_3N_4$) exists in the region on the substrate to be tested for the sub-electrode 21, the measured capacitance value $C_2$ is $C_{21+}C_{22}$;
wherein $$C_{21} = \frac{\varepsilon_0 S_2}{\frac{D_3}{\varepsilon_{glass}} + \frac{D_2}{\varepsilon_{SiO2}} + D_1}; \text{ and}$$

$$C_{22} = \frac{\varepsilon_0 S_3}{\frac{D_3}{\varepsilon_{glass}} + \frac{D_2}{\varepsilon_{SiO2}} + D_1 - D_4 + \frac{D_4}{\varepsilon_{foreign\ object}}};$$

where $S_3$ is an area of a part of a region on the substrate to be tested for the sub-electrode and a foreign object exists in the part of a region, $S_2$ is an area of a part of a region on the substrate to be tested for the sub-electrode and no foreign object exists the part of a region, $S_1 S_2+S_3$, and $D_4$ is a height of the foreign object.

Then, $$\Delta C = C_1 - C_2 =$$

$$\frac{\varepsilon_0 S_3}{\frac{D_3}{\varepsilon_{glass}} + \frac{D_2}{\varepsilon_{SiO2}} + D_1} - \frac{\varepsilon_0 S_3}{\frac{D_3}{\varepsilon_{glass}} + \frac{D_2}{\varepsilon_{SiO2}} + D_1 - D_4 + \frac{D_4}{\varepsilon_{foreign\ object}}}.$$

where $\varepsilon_{foreign\ object}$ is a relative dielectric constant of the foreign object, $S_3$ is an area of the foreign object, and $D_4$ is the height of the foreign object.

It is assumed that an area $S_1$ of the electrode plate=$10\times10$ square millimeters ($mm^2$)=$1\times10^{-4}$ square meters ($m^2$);

the area $S_3$ of the foreign object=$5\times5$ square micrometers ($\mu m^2$)=$2.5\times10^{-11}$ $m^2$;

the height $D_1$ of the vacuum layer=0.5 millimeters (mm) =$5\times10^{-4}$ meters (m);

the height $D_2$ of the $SiO_2$ layer=0.25 micrometers ($\mu m$) =$2.5\times10^{-7}$ m;

the height $D_4$ of the foreign object=0.05 $\mu m$=$5\times10^{-8}$ m;

the height $D_3$ of the substrate to be tested=0.5 mm=$5\times10^{-4}$ m;

the dielectric constant $\varepsilon_0$ of the vacuum medium=$8.85\times10^{-12}$ picofarad per meter (F/m);

the relative dielectric constant $\varepsilon_{foreign\ object}$ of the foreign object=8 F/m;

the relative dielectric constant $\varepsilon_{glass}$ of the substrate to be tested=3.7 F/m; and the relative dielectric constant $\varepsilon_{SiO2}$ of the $SiO_2$ layer=3.9 F/m.

Then, the calculated $\Delta C$=$0.096\times10^{-15}$ picofarad (F), $C_1$=$1.3926\times10^{-12}$F; and
a capacitance change rate $$\frac{\Delta C}{C_1} = 0.07\%.$$

Capacitance testers in business may meet the testing requirements.

Although the embodiments disclosed in the present disclosure are as described above, the described content is merely embodiments used to facilitate the understanding of the present disclosure, and are not intended to limit the present disclosure. Any modification and variation in the form and details of the implementation can be made by those skill in the art to which the present disclosure belongs without departing from the spirit and scope of the present disclosure. The patent protection scope of the present disclosure shall still be defined by the scope defined by the appended claims.

We claim:
1. A detection device, comprising:
a capacitance generation circuit comprising a first capacitance electrode and a second capacitance electrode disposed opposite to each other, and a power source coupled to the first capacitance electrode and the second capacitance electrode, wherein the first capacitance electrode is an electrode plate, and the second capacitance electrode comprises n sub-electrodes which are provided to be insulated from each other, the n sub-electrodes are arranged in X rows and Y columns, wherein X and Y integers greater than 1 and n is an integer greater than 2;
at least one capacitance detection circuit coupled to the electrode plate and the n sub-electrodes, and configured to detect a capacitance value between the electrode plate and the n sub-electrodes in response to a substrate to be tested being placed on one side of the electrode plate which is close to the second capacitance electrode; and
a controller configured to determine, according to the detected capacitance value, whether a foreign object exists in a region on the substrate to be tested or not;
wherein the detection device comprises one capacitance detection circuit, and
wherein the detection device further comprises n switching units disposed between the n sub-electrodes and the capacitance detection circuit, and the n switching units configured to control turn-on and turn-off of connections between the n sub-electrodes and the capacitance detection circuit respectively.

2. The detection device according to claim 1, wherein the capacitance generation circuit further comprises: an insulating plate in which the n sub-electrodes are embedded.

3. The detection device according to claim 2, wherein the capacitance generation circuit further comprises: an electrical connection plate disposed on one side of the insulating plate away from then sub-electrodes; and a wire configured to connect the n sub-electrodes to the electrical connection plate through via holes in the insulating plate, and connect the n sub-electrodes to the power source through the electrical connection plate.

4. The detection device according to claim 2, further comprising: a lifting apparatus coupled to the insulating plate, wherein the lifting apparatus is configured to drive the second capacitance electrode to move in a direction perpendicular to the first capacitance electrode under a control of the controller.

5. The detection device according to claim 3, further comprising: a lifting apparatus coupled to the electrical connection plate, wherein the lifting apparatus is configured to drive the second capacitance electrode to move in a direction perpendicular to the first capacitance electrode under a control of the controller.

6. The detection device according to claim 1, wherein the n sub-electrodes have the same size and shape.

7. The detection device according to claim 1, wherein the n sub-electrodes are arranged in an array.

8. The detection device according to claim 1, wherein there are n capacitance detection circuits, and the capacitance detection circuits are coupled to the sub-electrodes in one-to-one correspondence.

9. The detection device according to claim 1, wherein the electrode plate is a metal film, and the sub-electrodes are metal sheets.

10. The detection device according to claim 1, further comprising: a test abutment configured to support the electrode plate.

11. The detection device according to claim 1, wherein the controller is configured to:

compare the capacitance value with a standard capacitance value, and determine that a foreign object exists in the region on the substrate to be tested, in response to an absolute value of a difference between the capacitance value and the standard capacitance value being greater than a preset threshold; and determine that no foreign object exists in the region on the substrate to be tested, in response to the absolute value of the difference between the capacitance value and the standard capacitance value being less than or equal to the preset threshold.

12. The detection device according to claim 11, wherein the standard capacitance value is set to a capacitance value between the n sub-electrodes and the electrode plate when no foreign object exists in the region on the substrate to be tested.

13. The detection method according to claim 11, wherein determining whether a foreign object exists in a region on the substrate to be tested or not comprises:

comparing, by the controller, the capacitance value with a standard capacitance value, and determining that a foreign object exists in the region on the substrate to be tested, in response to an absolute value of a difference between the capacitance value and the standard capacitance value being greater than a preset threshold; and determining, by the controller, that no foreign object exists in the region on the substrate to be tested, in response to the absolute value of the difference between the capacitance value and the standard capacitance value being less than or equal to the preset threshold.

14. The detection method according to claim 13, wherein the standard capacitance value is set to a capacitance value between the sub-electrodes and the electrode plate when no foreign object exists in the region on the substrate to be tested.

15. A detection method applied to the detection device according to claim 1, comprising:

supplying, by a power source, power to the first capacitance electrode and the second capacitance electrode in the capacitance generation circuit;

detecting, by the capacitance detection circuit, a capacitance value between the electrode plate and the n sub-electrodes in response to the substrate to be tested being placed on one side of the electrode plate which is close to the second capacitance electrode; and determining, by the controller, according to the detected capacitance value, whether a foreign object exists in a region on the substrate to be tested or not.

* * * * *